(12) United States Patent
Li et al.

(10) Patent No.: US 6,813,589 B2
(45) Date of Patent: Nov. 2, 2004

(54) METHOD AND APPARATUS FOR DETERMINING SYSTEM RESPONSE CHARACTERISTICS

(75) Inventors: Mike Peng Li, Palo Alto, CA (US); Jan Brian Wilstrup, Mounds View, MN (US)

(73) Assignee: Wavecrest Corporation, Eden Prairie, MN (US)

( * ) Notice: Subject to any disclaimer, the term of this patent is extended or adjusted under 35 U.S.C. 154(b) by 112 days.

(21) Appl. No.: 09/997,143

(22) Filed: Nov. 29, 2001

(65) Prior Publication Data

US 2003/0098696 A1 May 29, 2003

(51) Int. Cl.$^7$ .............................................. G06F 15/00
(52) U.S. Cl. ...................... 702/191; 702/194; 324/613
(58) Field of Search ................................ 324/612, 613, 324/614, 615, 76.52, 76.53, 76.77; 702/109, 111, 191, 194; 375/376

(56) References Cited

U.S. PATENT DOCUMENTS

| | | | | |
|---|---|---|---|---|
| 3,614,622 A | | 10/1971 | Holsinger | 325/42 |
| 4,853,903 A | * | 8/1989 | Linville, Jr. et al. | 367/46 |
| 4,908,784 A | | 3/1990 | Box et al. | 364/569 |
| 5,943,429 A | * | 8/1999 | Handel | 381/94.2 |
| 6,161,076 A | * | 12/2000 | Barr et al. | 702/17 |
| 6,185,509 B1 | | 2/2001 | Wilstrup et al. | 702/69 |
| 6,194,925 B1 | | 2/2001 | Kimsal et al. | 327/132 |
| 6,272,441 B1 | * | 8/2001 | Peyerl et al. | 702/112 |
| 6,396,889 B1 | * | 5/2002 | Sunter et al. | 375/376 |

OTHER PUBLICATIONS

Allan, David W. et al., "Chapter 8—Statistics of Time and Frequency Data Analysis," pp. 151–204, *Time and Frequency: Theory and Fundamentals*, Byron E. Blair, Ed., U.S. Department of Commerce, May 1974.

Allan, David W. et al., "Chapter 9—The National Bureau of Standards Atomic Time Scale: Generation, Stability, Accuracy and Accessibility," pp. 205–231, *Time and Frequency: Theory and Fundamentals*, Byron E. Blair, Ed., U.S. Department of Commerce, May 1974.

* cited by examiner

*Primary Examiner*—Marc S. Hoff
*Assistant Examiner*—Paul Kim
(74) *Attorney, Agent, or Firm*—Merchant & Gould P.C.

(57) ABSTRACT

A system for determining a response characteristic of an nth order linear system, such as a phase locked loop, is disclosed. An input signal is supplied to the linear system, and the system measures an output signal produced by the linear system. A variance record is constructed for a measurable quantity, such as jitter, extracted from the output signal. The response characteristic of the linear system is then obtained from the variance record. The response characteristic, such as the transfer function, noise processes, and/or power spectral density (PSD), may be found through a numerical or analytical solution to a mathematical relationship between a response function of the nth order linear system and the variance record.

34 Claims, 6 Drawing Sheets

METHOD AND APPARATUS FOR DETERMINING SYSTEM RESPONSE CHARACTERISTICS

TECHNICAL FIELD

The present invention relates to the determination of a response characteristic of an nth order linear system. More particularly, the present invention relates to determination of the response characteristic from a variance measured in the output signal of the linear system.

BACKGROUND

Nth order linear systems, such as phase locked loops (PLLs) and other electrical devices that can be approximated as behaving linearly, produce an output signal in response to receiving an input signal. The output signal has a variance at any point in time from an expected or mean output signal value. The output signal and its variation over time results from the interaction of the input signal, the transfer function of the linear system, and any noise processes that are present which may include periodic processes. Noise processes may originate externally or within the linear system and this noise degrades the performance of the linear system.

When designing a linear system, the input signal, noise processes, and transfer function can be assumed for and/or estimated from simulations. However, when the linear system is to be constructed, for example, into an integrated circuit prototype, there is only access to the input and output signals. Details of the response including the noise processes and transfer function of this prototype cannot be directly measured. However, knowing the details of the response of the linear system prototype is important to confirm the design specification and simulation assumptions and to allow any design flaws and noise to be identified, fixed, and/or improved.

A conventional method of finding response characteristics for a linear system has been to apply a fast Fourier transform (FFT) approach to obtain a response characteristic such as the power spectral density (PSD) from the output signal. This approach is limited in its application because the FFT approach requires uniform sampling of the input to the FFT which is the output signal of the system under test. Uniform sampling necessitates increased recording and storage requirements and creates poor resolution for low frequencies. Furthermore, the FFT is known to be an inefficient narrowband approach when applied to broadband systems.

Therefore, there is a need for additional methods that can determine response characteristics of an nth order linear system through access to the output signal.

SUMMARY

Embodiments of the present invention address the problems discussed above and others such as by measuring an output signal of the nth order linear system and constructing a variance record of a measurable quantity from the output signal. For example, jitter variance of a PLL may be measured as a function of time. A response characteristic of the linear system is then obtained from a mathematical relationship to the variance record. Alternatively, a PSD record may be obtained by various methods from the output signal, and the transfer function may be found by modeling an assumed response function to the PSD record to find transfer function parameters.

The response characteristic may be obtained from the variance record through numerical or analytical means or by a combination. For example, the response characteristic, such as a PSD record, may be found from a direct numerical solution to an inhomogenous Fredholm integral of the first kind, see reference below, that has been adapted to relate the variance record to an unknown transfer function. A transfer function model may also be analytically fitted to the PSD to obtain the zeros and complex and real poles.

Alternatively, a variance model that is a generic solution to the Fredholm integral may be fitted to the variance record to construct the response characteristic. By fitting the variance model to the variance record, parameters of the transfer function of the linear system, such as the damping factor and natural frequency of a second order linear system, may be found. From the transfer function parameters, the noise processes of the linear system may also be derived, such as by mathematical relationships between the transfer function and noise spectral density. The transfer function provides the zeros and complex and real poles as well as other physical parameters of the linear system such as the impulse response and/or step response.

Furthermore, by fitting a model mathematically related to the response function to the variance record or PSD record, an error estimate for the response characteristic being found may be generated. The fitting process provides a residue that results from the imperfections of the fit of the model. The total residue of imperfections can be used for relative comparisons to other attempts to attain the response characteristic, and thereby provide guidance as to accuracy.

DETAILED DESCRIPTION

Various embodiments of the present invention will be described in detail with reference to the drawings, wherein like reference numerals represent like parts and assemblies throughout the several views. Reference to various embodiments does not limit the scope of the present invention, which is limited only by the scope of the claims attached hereto.

Figure 0:
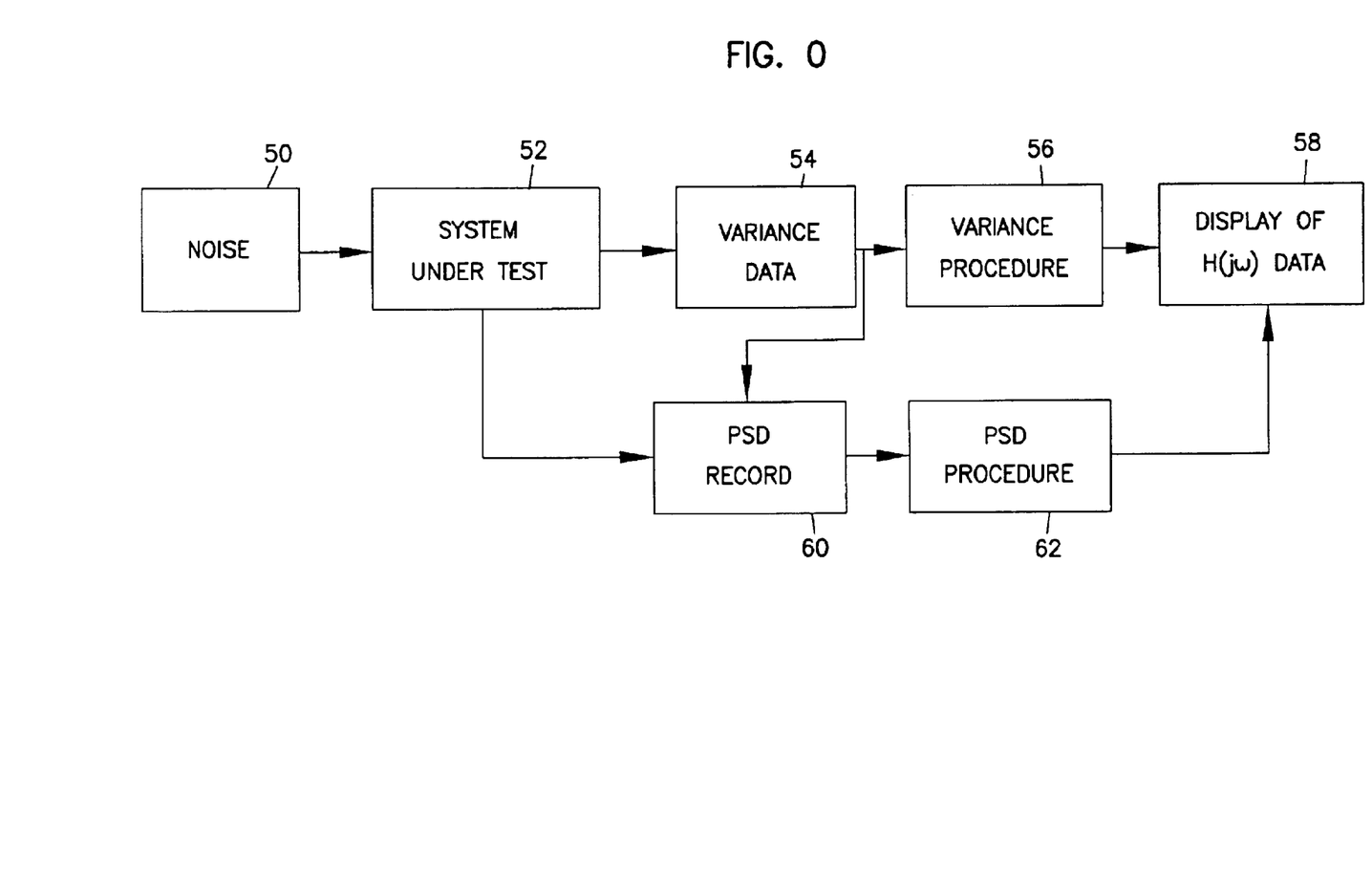
FIG. 0 is a diagram illustrating the main process flow and alternative approaches of embodiments of the present invention.

FIG. 0 is an exemplary process flow for finding a response characteristic such as the transfer function of a linear system in accordance with embodiments of the present invention. The details of the individual portions of the process flow are discussed in greater detail with reference to the remaining figures. A noise source 50 provides an input signal to the nth order linear system 52 that is under test. The input signal may contain noise, multiple Fourier series, and/or any arbitrary periodic. The system 52 under test produces an output signal that contains measurable quantities that vary from a mean value for the output signal, and this difference from the mean for the various samples of the measurable quantity establishes variance data 54. The variance data measured with respect to time or space is maintained as a variance record.

A variance procedure 56 may then be applied to the variance record to find parameters for the transfer function of the nth order linear system and/or PSD. The variance record is equal to an equation, or variance model, whose unknowns are also the unknown parameters of the transfer function whose basic form is generally known for the nth order linear system. The variance procedure 56 may involve analytically fitting a variance model based on an assumed generic transfer function form, or may involve assuming a transfer function form and pole-zero placement, solving an integral relationship between the transfer function and variance record and repeating until the integral solution most closely fits the actual variance record. Once the transfer function parameters describing the response are found, transfer function data 58 may be displayed such as in the form of a pole-zero plot, an impulse response, a step response, etc.

As an alternative to using the variance procedure with the variance data 54, the variance data 54 may be converted to a power spectrum density (PSD) record 60 through a numerical solution involving multiple filter banks, discussed below. The PSD record 60 may also come more directly from the system under test 52. After the PSD record 60 is found, a PSD procedure 62 is used to model the transfer function by fitting a pole-zero function to the PSD record 60. The transfer function data 58 is then available as it was when produced by the variance procedure 56.

Figure 1:
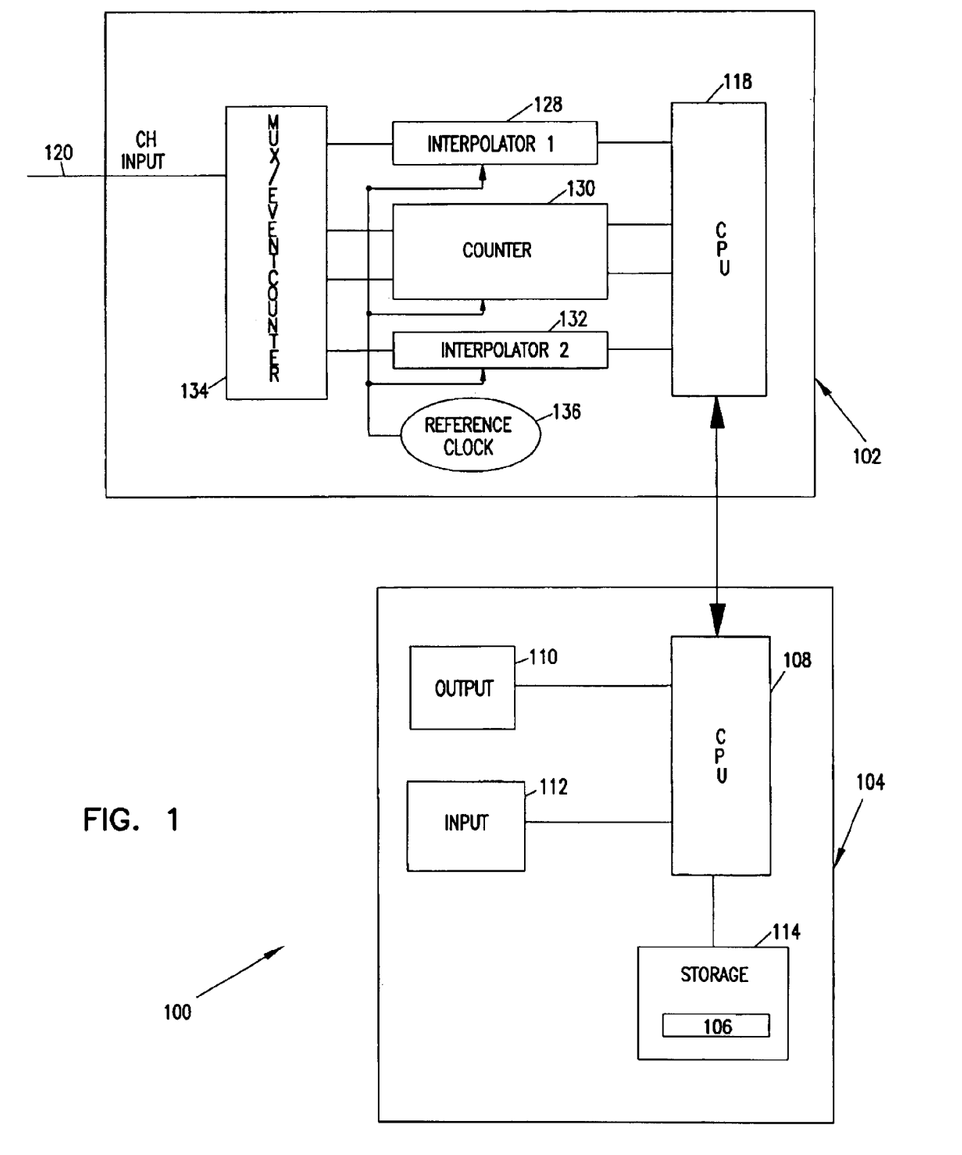
FIG. 1 is an exemplary system employed by the process flow of FIG. 0 for determining the response characteristic of an nth order linear system.

FIG. 1 is an exemplary illustration of a representative hardware environment for a signal analyzing system 100 according to an exemplary embodiment of the present invention. A typical configuration may include a measurement apparatus 102 that measures the time interval between two events (start and stop) through counters. A measurement apparatus is disclosed in U.S. Pat. No. 4,908,784, which is hereby incorporated by reference. A typical measurement apparatus is the Wavecrest DTS-2075, available from Wavecrest Corporation, Edina, Minn.

Those skilled in the art will recognize that other systems that enable signal analysis that are based on real world measurement (i.e., measurements that are non-ideal or subject to uncertainty) would be applicable. These devices include an oscilloscope, Automated Test Equipment (ATE), spectrum analyzer, network analyzer, TIA (time interval analyzer), universal time frequency counter, and modulation domain analyzer.

The measurement apparatus 102 interfaces to a workstation 104 and operates under the control of an analysis program 106 resident on the workstation 104. The analysis program 106 is typically implemented through data analysis software. One commercially available analysis software is the Wavecrest Virtual Instrument Signal Integrity (VISI) software, available from Wavecrest Corporation, Edina, Minn. Other analysis software includes LABVIEW, MathCad, MATLAB, and Mathematica, among others. The workstation 104 comprises a processor 108 and a memory including random access memory (RAM), read only memory (ROM), and/or other components. The workstation 104 operates under control of an operating system, such as the UNIX® or the Microsoft® Windows NT operating system, stored in the memory to present data to the user on the output device 110 and to accept and process commands from the user via input device 112, such as a keyboard or mouse.

The analysis program 106 of the present invention is preferably implemented using one or more computer programs or applications executed by the workstation 104. Those skilled in the art will recognize that the functionality of the workstation 104 may be implemented in alternate hardware arrangements, including a configuration where the measurement apparatus 102 includes CPU 118, memory, and I/O capable of implementing some or all of the steps performed by the analysis program 106. Generally, the operating system and the computer programs implementing the present invention are tangibly embodied in a computer-readable medium, e.g. one or more data storage devices 114, such as a zip drive, floppy disc drive, hard drive, CD-ROM drive, firmware, or tape drive. However, such programs may also reside on a remote server, personal computer, or other computer device.

The analysis program 106 provides for different measurement/analysis options and measurement sequences. The analysis program 106 interacts with the measurement apparatus 102 through the on-board CPU 118. In one embodiment, the measurement apparatus 102 provides arming/enabling functionality such that the apparatus 102 can measure a signal either synchronously or asynchronously. The output signal of the nth order linear system is fed to a channel input 120. The multiplexer/event counter 134 is triggered on the clock edges received through the input 120 and provides an indication of the triggers to counter/interpolators 128, 130, and 132. The counter/interpolators 128, 130, and 132 are driven by an on-board clock 136 and measure the time elapse between the start and stop events. The counter 130 provides a coarse measurement while the interpolators 128, 132 provide fine time resolution down to 0.8 ps. The clock 136 is typically a precise crystal oscillator.

Those skilled in the art will recognize that the exemplary environment illustrated in FIG. 1 is not intended to limit the present invention. Indeed, those skilled in the art will recognize that other alternative hardware environments may be used without departing from the scope of the present invention.

Figure 2:
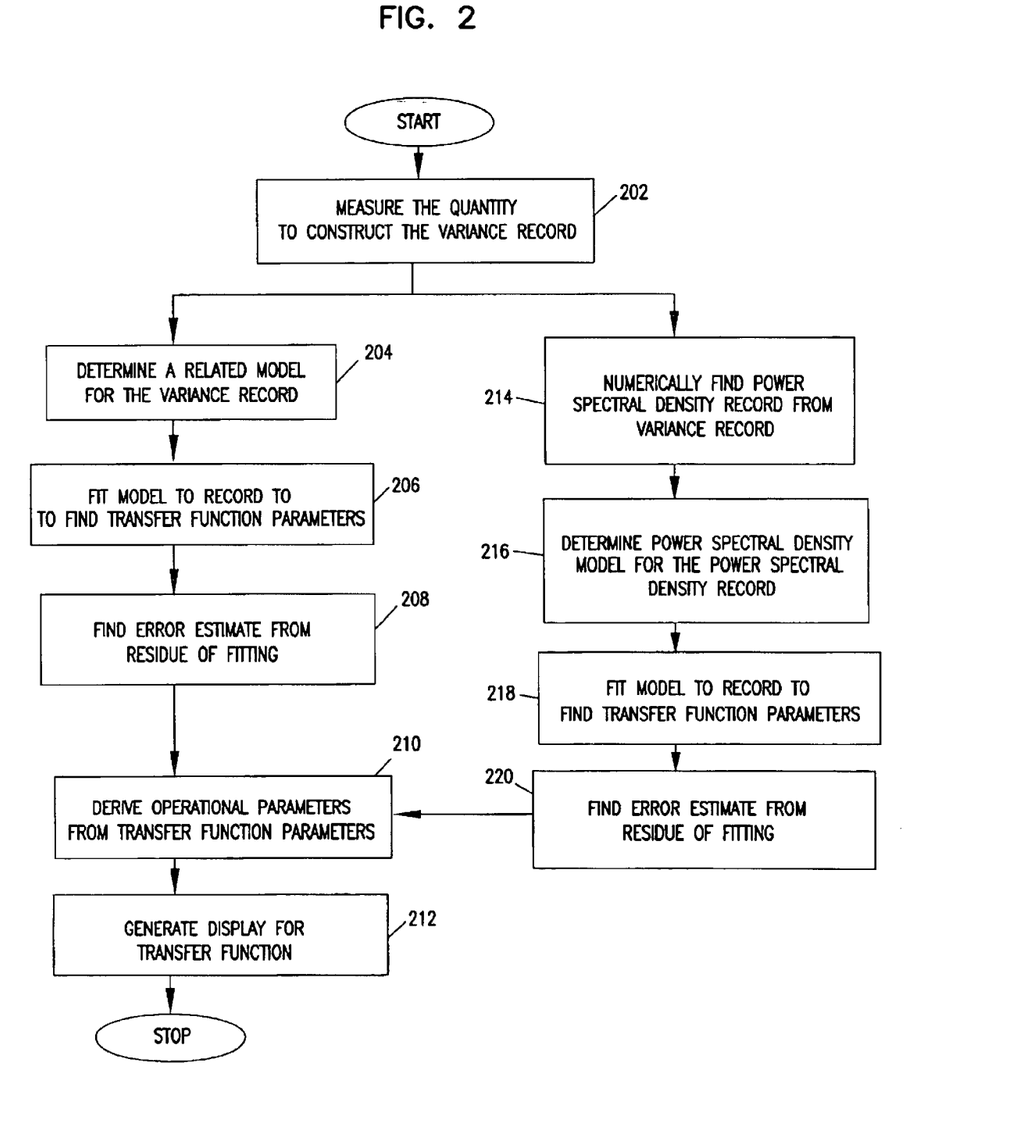
FIG. 2 is an exemplary operational flow showing the alternative operations that may be utilized by the system of FIG. 1.

As shown, in FIG. 2, the operational flow of the signal analyzing system 100 begins at variance record operation 202. Here, the measurement apparatus 102 makes measurements of a measurable quantity from the output signal of the system being tested. For example, the jitter of the output may be measured on a per edge basis as a function of time, or voltage of the output may be measured as a function of time. Other quantities varying in time or space may be measured and used as well. The workstation 104 receives the measurement of the measurable quantity and constructs a variance record estimating the variance based on the measurements. The measured variance record $VAR_{measured}(\tau)$ for magnitude (MAG) measurements is shown in equation (1) where $MAG_{iA}(\tau)$ is the difference in magnitude for two measurements forming a sample pair taken from the output signal where the measurements are separated by $\tau$ in time or space, $\overline{MAG}_A(\tau)$ represents the mean of the $MAG_{iA}(\tau)$ values and Lmax is the total number of $MAG_{iA}(\tau)$ values.

$$VAR_{measured}(\tau) = \frac{1}{L\max - 1} \sum_{i=1}^{L\max} [MAG_{i\Delta}(\tau) - \overline{MAG}_\Delta(\tau)]^2 \quad (1)$$

Figure 3:
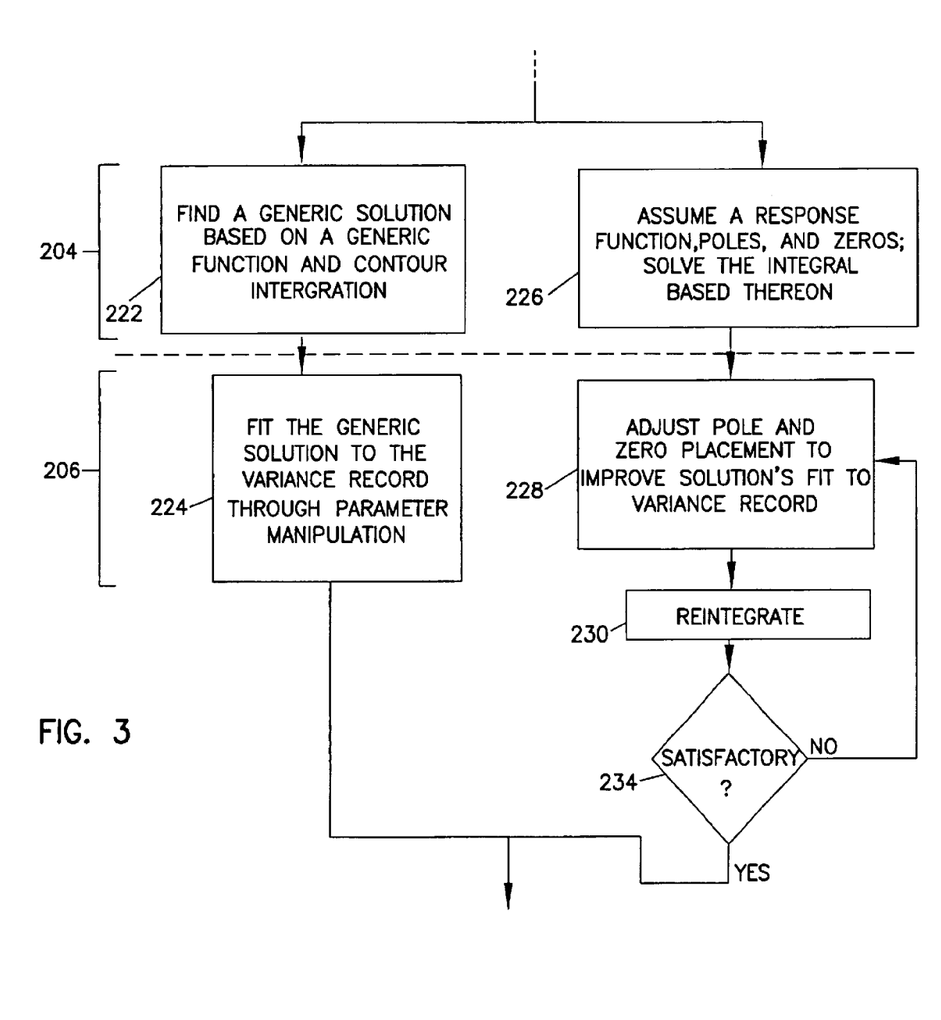
FIG. 3 is an exemplary operational flow showing the alternative operations of the model determination and fitting procedure of FIG. 2.

Non-uniform sampling schedules, i.e. logarithmic, etc., may be used to generate the variance record including sampling schedules that are arbitrary. After the variance record has been generated, the workstation 104 may take one of two different basic approaches, proceed based on the variance record or convert to a PSD record and proceed with the PSD record. In the variance record approach, at variance model operation 204 and fitting operation 206, the workstation 104 can take a generic response function approach to finding the transfer function parameters or a specific assumed response function approach. These two approaches are shown in FIG. 3 and are discussed in more detail below.

For either approach, a simplification of $VAR_{model}(\tau)$ is possible because the noise PSD at the output is equal to the noise PSD at the input multiplied by the square of the transfer function's absolute value and because $VAR_{model}(\tau)$ is equal to $VAR_{model}(0)$ minus the inverse Fourier transform of the output PSD. The PSD may be estimated as described in U.S. Pat. No. 6,185,509 which is hereby incorporated by reference. Thus, $VAR_{model}(\tau)$ can be simplified into equation (2) which is an inhomogenous Fredholm integral of the first kind. See Press et al., Numerical Recipes in C. *The Art of Scientific Computing*, 2d ed, p. 788, Cambridge University Press, 1992.

$$VAR_{model}(\tau) = \int_{\omega_{lo}}^{\omega_{hi}} [F(\omega, \tau)][H(j\omega)]^2 [S_{input}(\omega)] d\omega \quad (2)$$

$[F(\omega, \tau)]$ may be expressed as $1-\cos(\omega\tau)$, or may take various other forms including a $\sin^2$ expression, an exponential expression, or a power series. The variance record $VAR_{measured}(\tau)$ is a function of both the transfer function $H(j\omega)$ and input noise spectral density $[S_{input}(\omega)]$ of the nth order linear system being tested. When white noise is used as the input signal, the Fredholm integral of equation (2) may be simplified by removing the $[S_{input}(\omega)]$ component as the spectral density of white noise reduces to a constant that is absorbed into $H(j\omega)$.

Using the generic response function approach, which begins at variance model operation 222, the workstation 104 finds a variance model $VAR_{model}(\tau)$ that is to be fit to the variance data record $VAR_{measured}(\tau)$ previously created. Fitting $VAR_{model}(\tau)$ requires finding a variance function that closely matches $VAR_{measured}(\tau)$. Finding $VAR_{model}(\tau)$ for $VAR_{measured}(\tau)$ can be done at variance model operation 222 by solving equation (2) with $[S_{input}(\omega)]$ removed due to application of white noise at the input. Other input signals may be used as well where the PSD for the input signals is known. In the example where white noise is used, an analytical solution to equation (2) involves using a generic (i.e., unknown zero and pole values) transfer function $H(j\omega)$ known for the particular linear system being tested in equation (2) and finding a generic solution.

Once $VAR_{model}(\tau)$ has been obtained, it is fit to $VAR_{measured}(\tau)$ at fitting operation 224. Fitting operation 224 involves manipulating the transfer function parameters that are present in the $VAR_{model}(\tau)$ function using a least squared or chi squared fitting procedure to minimize the difference between $VAR_{model}(\tau)$ and $VAR_{measured}(\tau)$. Once the $VAR_{model}(\tau)$ function has been manipulated to minimize the difference, the transfer function parameters are extracted form $VAR_{model}(\tau)$ and can be subsequently used as discussed below to analyze the system under test.

The discussion included below in relation to operations 222 and 224 specifically references a second order system but only for exemplary purposes. One skilled in the art will realize that the embodiments of the present invention are applicable to systems of other orders. Using a second order system as an example is useful due to second order systems providing a rough approximation for higher order systems. Equation (3) is a generic transfer function for a PLL example approximated by a second order linear system. Equation (4) is a generic solution to equation (2) for the underdamped case of the PLL, equation (5) is a generic solution to equation (2) for the overdamped case of the PLL, and equation (6) is a generic solution to equation (2) for the neutral case of the PLL. Equations (4), (5), and (6) are derived at model operation 222 from equation (2) with $\omega_{lo}$ equal to zero and $\omega_{hi}$ equal to infinity.

$$H(s) = \frac{2\zeta\omega_n s + \omega_n^2}{s^2 + 2\zeta\omega_n s + \omega_n^2} \quad (3)$$

$$VAR_{model}(\tau) = \frac{\zeta\omega_n \pi}{2\sqrt{\zeta^2 - 1}} \quad (4)$$

$$\left\{ \frac{c_2^2 - c_3^2}{c_2}(1 - e^{-c2\omega_n \tau}) - \frac{c_1^2 - c_3^2}{c_1}(1 - e^{-c1\omega_n \tau}) \right\} \text{ where } \zeta > 1,$$

$$c_1 = [(2\zeta^2 - 1) - 2\zeta\sqrt{\zeta^2 - 1}]^{1/2}, c_2 = [(2\zeta^2 - 1) + 2\zeta\sqrt{\zeta^2 - 1}]^{1/2},$$

$$\text{and } c_3 = \frac{1}{2\zeta}.$$

$$VAR_{model}(\tau) = \frac{\omega_n \pi}{8\zeta\sqrt{1 - \zeta^2}} \quad (5)$$

$$\left\{ \left[\sqrt{1 - \zeta^2}(4\zeta^2 + 1) + 4\zeta^3 - \zeta\right][1 - e^{-\zeta\omega_n \tau} \cdot \cos(\sqrt{1 - \zeta^2}\,\omega_n \tau)] - \left[\sqrt{1 - \zeta^2}(4\zeta^2 + 1) + \zeta - 4\zeta^3\right]e^{-\zeta\omega_n \tau} \right.$$

$$\left. \sin(\sqrt{1 - \zeta^2}\,\omega_n \tau)] \right\} \text{ where } \zeta < 1.$$

$$VAR_{model}(\tau) = \frac{\omega_n \pi}{4}[5 + (3\omega_n \tau - 5)e^{-\omega_n \tau}] \text{ where } \zeta = 1. \quad (6)$$

In the generic transfer function of equation (3) for the second order linear system and generic solutions of equations (4), (5), and (6), the unknown parameter $\zeta$ is the damping factor of the second order linear system and the unknown parameter $\omega_n$ is the natural frequency. Using a least squared fit, chi squared fit, or other fitting method known in the art at fitting operation 224, these unknown parameters in the generic solution of equation (4), (5), or (6), depending upon the damping of the linear system being tested, are manipulated until a satisfactory fit is achieved. A satisfactory fit is one that has generally minimized the difference in each value of $VAR_{model}(\tau)$ and $VAR_{measured}(\tau)$ for each of the values of the variance record. The resulting values for these parameters, $\omega_n$ and $\zeta$, in the appropriate generic solution to equation (2) are also the values for the unknowns of the transfer function $H(j\omega)$ of the second order linear system being tested.

If the damping characteristics of the system under test are unknown, then equations for all three cases may be used and the variance model that best fits the variance record of the system will be adequate to use when extracting the transfer function parameters.

Once the variance model has been properly fitted to the variance record by finding the proper value for $\omega_n$ and $\zeta$ for the second order linear system, operational flow transitions to error estimate operation 208 of FIG. 2. Subsequently, the response characteristic is found by establishing the transfer function $J(j\omega)$ of the nth order linear system through plugging the $\omega_n$ and $\zeta$ parameters into the generic transfer function known for the linear system. The transfer function now indicates the poles and zeros of the linear system.

Another approach involving the variance record directly is shown in FIG. 3. Rather than finding a generic variance model solution that can be fit to the variance record, a pole-zero response function may be assumed having particular pole-zero locations. The mathematical expression of equation (2) may then be solved for all values of $\tau$ to find a derived variance record model at model operation 226 which is compared to the constructed variance record taken from the output signal of the system under test. Then, the derived variance record model may be fit to the variance record at fitting operation 206 by pole-zero operation 228 altering the pole-zero locations of the pole-zero response function previously assumed.

After altering the pole-zero locations, a new derived variance record model is found at integration operation 230 by again solving the Fredholm integral of equation (2). Query operation 234 tests whether the derived variance record model is satisfactory based on the residue of imperfection between the derived variance record model and the constructed variance record model. It is desirable to minimize the residue to provide the best fit. Once a satisfactory derived variance record model has been found, the pole-zero locations of the response function used to produce the variance record are taken as the pole-zero locations of the response function for the system under test. Operational flow then proceeds to error estimate operation 208 of FIG. 2.

Regardless of the approach taken for using the variance record to obtain the response characteristic, such as the pole-zero locations of the transfer function, it is desirable to know the accuracy of the assumptions, such as the assumption of the number of poles an zeros of the system under test. Furthermore, it is desirable to know the accuracy of the positioning of the poles and zeros that result from the fitting procedure. Therefore, an error estimate may be generated at error estimate operation 208 by accumulating the residue, or imperfection of the fitting procedure. This error estimate may be used as a basis for comparison to other attempts to obtain the transfer function parameters, and it is desirable to find the transfer function parameters that produces the smallest error estimate.

As an alternative to the direct variance record approach of variance model operation 204 and fitting operation 206, an embodiment of the operational flow may involve finding a PSD record from the variance record at PSD operation 214. The PSD record results from a numerical solution to the mathematical relationship between the variance record and the transfer function. One example of a direct numerical solution involves a piecewise approach whereby $[H(j\omega)]^2$ is split into a PSD estimate $E(\omega_m)$ multiplied by a generically chosen filter bank $[H_{FBm}(\omega)]^2$. The filter bank may be selected to have $M_{max}$ bandpass filters each with a different center frequency, with each filter of the filter bank being chosen as an integrateable function over a specific band between $\omega_{Mlo}$ to $\omega_{Mhi}$ when multiplied with $[F(\omega, \tau_L)]$. The center frequencies of the filter bank are spread across the band of $\omega_{lo}$ to $\omega_{hi}$. $E(\omega_m)$ is assumed to be a constant across corresponding integration limits and is therefore removed from the integral of equation (2). The result is shown below as equation (7), which is solved for all values of L up to Lmax discussed in relation to equation (1).

$$VAR_{measured}(\tau_L) = \sum_{M=1}^{M\max} E(\omega_M) \int_{\omega_{Mlo}}^{\omega_{Mhi}} [F(\omega, \tau_L)][H_{FBm}(j\omega)]^2 d\omega \quad (7)$$

The limits of integration, $\omega_{Mlo}$ to $\omega_{Mhi}$, change as each filter changes across the band of $\omega_{lo}$ to $\omega_{hi}$. Equation (7) can be simplified using a set of coefficients $A_{ML}$ for all values M and L up to Mmax and Lmax, respectively, as shown in equation (8).

$$VAR_{measured}(\tau_L) = \sum_{M=1}^{M\max} E(\omega_M) A_{LM}, \quad (8)$$

$$\text{where } A_{LM} = \int_{\omega_{Mlo}}^{\omega_{Mhi}} [F(\omega, \tau_L)][H_{FBm}(j\omega)]^2 d\omega$$

A matrix of simultaneous equations relating $A_{LM}E_M$ to $VAR(\tau_L)$ can be configured according to equation (8). This matrix of simultaneous equations is shown as equation set (9). $E(\omega_M)$ is expressed as $E_M$ in equation (9) since each instance $E_M$ is assumed to be constant. The variables $E_M$ of equation (9) are the only unknown values.

$$A_{11}E_1 + A_{12}E_2 + \ldots A_{1M\max}E_{M\max} = VAR(\tau_1) \quad (9)$$

$$A_{21}E_1 + A_{22}E_2 + \ldots A_{2M\max}E_{M\max} = VAR(\tau_2)$$

$$\vdots$$

$$A_{L\max 1}E_1 + A_{L\max 2}E_2 + \ldots A_{L\max M\max}E_{M\max} = VAR(\tau_{L\max})$$

The set of values $E_M$ found from solving the matrix established by the equation set (9), provides a response characteristic, which is the PSD record, for the nth order linear system. The transfer function $H(j\omega)$ can be found by assuming a model pole-zero function for PSD, such as based on equation (2) for a second order system, in PSD model operation 216. The pole-zero function is analytically fit to the PSD record using a least squared or chi squared fit to manipulate the pole-zero locations at fitting operation 218. A least squared fit or chi squared fit minimizes the difference between the pole-zero function and the PSD record to obtain the pole-zero locations of the transfer function. The poles and zeros are then known for the transfer function.

Again, it is desirable to know the accuracy of the assumed pole-zero function, which is an assumption of the number of poles an zeros of the system under test. Furthermore, it is desirable to know the accuracy of the positioning of the poles and zeros that result from the fitting procedure. Therefore, an error estimate may be generated at error estimate operation 220 by accumulating the residue, or imperfection of the fitting procedure. This error estimate may be used as a basis for comparison to other attempts to obtain the transfer function parameters, and it is desirable to find the pole-zero model that produces the smallest error estimate.

After a determination of the transfer function $H(j\omega)$ for the nth order linear system as discussed above using the variance procedure of operations 204 through 206 or the PSD operations 214 through 216, operational parameters for the linear system may be derived from the transfer function $H(j\omega)$ and the noise processes may be found at derivation operation 210. For the PLL example, operational parameters including but not limited to pull-in time, pull-out range, lock-in time, and lock-in range may be found at derivation operation 210 through ordinary computations known in the art. Additionally, noise processes of the linear system may be found including the noise bandwidth through known computations based on the transfer function parameters. As discussed below, noise processes including input and/or output noise PSD may also be determined from the transfer function.

Figure 4:
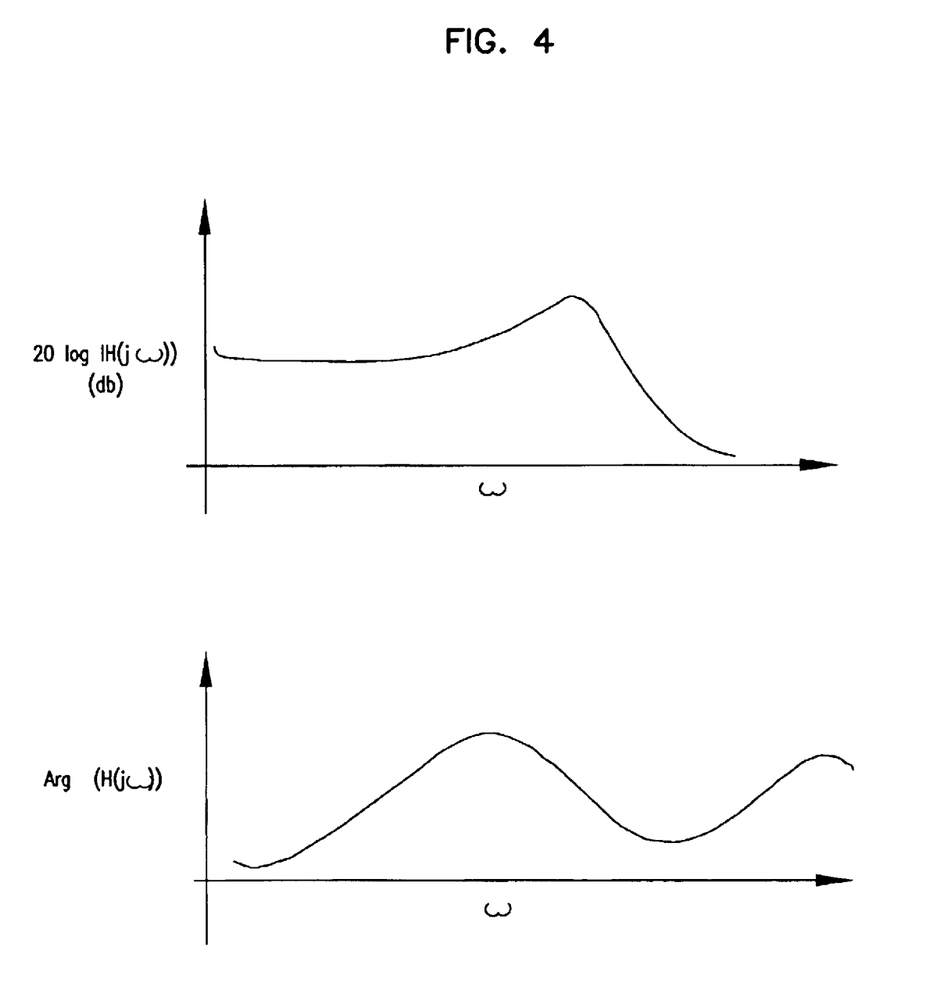
FIG. 4. is an exemplary graph of a Bode plot showing the poles and zeros of the transfer function determined for a linear system, such as a PLL, that is generated by the operational flow of FIG. 2.
Figure 5:
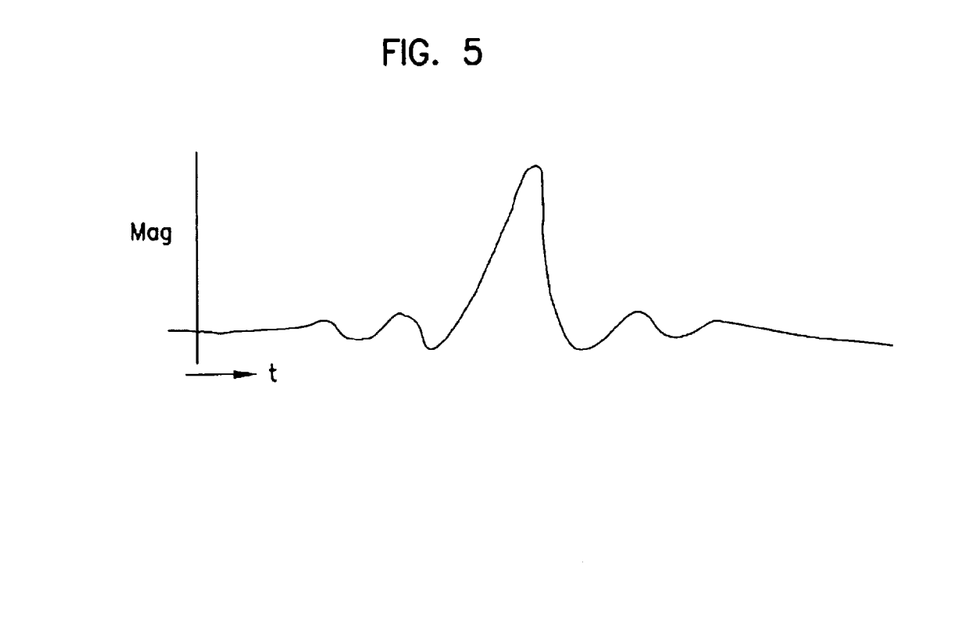
FIG. 5 is an exemplary impulse response for the nth order linear system that may be determined by the operational flow of FIG. 2 after the transfer function has been found.

Other information may also be obtained from the transfer function H(jω), such as the time domain function resulting from an inverse Laplacian transformation, the impulse response, the step response, the ramp response, and others. Once the noise processes, operational parameters, and additional responses have been determined in addition to the transfer function H(jω), the response of the nth order linear system including the transfer function H(jω) may be graphed, such as in a Bode plot or root locus plot at display operation 212, and may be provided through an output of the testing equipment. Furthermore, the poles and zeros of the nth order linear system are known from the transfer function H(jω) and will appear in the graph. FIG. 4 shows exemplary Bode plots for the PLL example containing the amplitude and phase as a function of frequency and FIG. 5 shows an exemplary impulse response.

Figure 6:
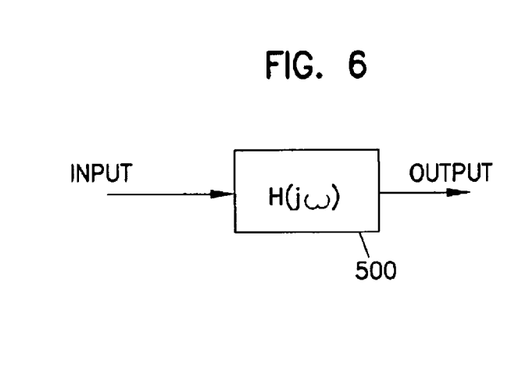
FIG. 6 is a diagram illustrating the application of the transfer function modeling the nth order system to predict an input or output signal magnitude.

FIG. 6 shows the application of the transfer function H(jω) that has been determined by the logical operations of FIG. 2. The linear system that has been tested can be expressed as a model 500 defined by the transfer function H(jω). If an input signal is known, the output magnitude can be determined through convolution in the time or space domain of the input magnitude and the transfer function H(jω), or by multiplication in the frequency domain. Likewise, if an output signal magnitude is known, the input magnitude that was provided to the linear system can be determined through deconvolution in the time or space domain of the output signal and the transfer function H(jω), or by division in the frequency domain.

Similarly, noise processes may be determined from the relationship between input noise PSD [$S_{input}(\omega)$] and output noise spectral density [$S_{output}(\omega)$]. The PSD for input noise is equal to the output noise spectral density multiplied by the magnitude of the transfer function squared in the frequency domain. The input noise source may be modeled as an nth order linear system through the process described above by creating a variance record directly from the noise source output being used as an input signal to the system under test. The input noise PSD record can then be determined as discussed above.

One skilled in the art will recognize that the analytical and numerical methods discussed above for finding a response characteristic from the variance record are exemplary only. Other methods are equally applicable, including approaches such as wavelet theory for relating the variance measured in the output signal to a response characteristic.

While the invention has been particularly shown and described with reference to preferred embodiments thereof, it will be understood by those skilled in the art that various other changes in the form and details may be made therein without departing from the spirit and scope of the invention.

What is claimed is:

1. A method for determining a response characteristic of an nth order linear system, comprising:
   supplying an input signal to the nth order linear system;
   measuring an output signal of the nth order linear system that occurs in response to the input signal;
   constructing a variance record of a non-uniformly sampled measurable quantity extracted from the output signal; and
   obtaining the response characteristic of the nth order linear system based on a mathematical relationship of the variance record of the measurable quantity and a response function.

2. The method of claim 1, wherein the nth order linear system is a phase locked loop, and wherein supplying the input signal comprises supplying a train of clock pulses to the phase locked loop.

3. The method of claim 2, wherein the output signal is a train of clock pulses and the measurable quantity is jitter of the output signal, and wherein constructing a variance record comprises constructing a record of the jitter variance of the output signal as a function of time.

4. The method of claim 1, wherein the response function is a transfer function and where obtaining the response characteristic comprises generating an expression for the transfer function of the nth order linear system by manipulating transfer function parameters to fit a variance model to the variance record.

5. The method of claim 4, wherein generating an expression for the transfer function comprises fitting a variance model to the variance record by manipulating a natural frequency parameter and a damping factor parameter of the transfer function to find a best fit for the variance record of the measurable quantity.

6. The method of claim 1, wherein the response function is a transfer function and wherein obtaining the response characteristic comprises finding a power spectral density for the nth order linear system by numerically solving the mathematical relationship between the variance record and the response function.

7. The method of claim 6, wherein numerically solving the mathematical relationship involves finding a numerical solution using a filter bank and corresponding frequency bands.

8. The method of claim 3, wherein the response function is a transfer function and wherein obtaining the response characteristic comprises generating an expression for the transfer function of the phase locked loop including fitting a jitter variance model to the jitter variance record and determining a damping factor and natural frequency for the transfer function that are present in the jitter variance model and that best fit the jitter variance model to the jitter variance record.

9. The method of claim 4, wherein obtaining the response characteristic further comprises deriving operational parameters from the transfer function.

10. The method of claim 4, wherein obtaining the response characteristic further comprises deriving noise processes from the mathematical relationship between the transfer function and input and output noise power spectral density.

11. The method of claim 4, wherein generating an expression for the transfer function comprises analytically solving for a natural frequency and a damping factor based on complex or real poles of the linear system.

12. The method of claim 6, wherein the mathematical relationship involves a Fredholm integral and numerically solving the mathematical relationship involves finding a numerical solution to the Fredholm integral.

13. A system for determining a response characteristic of an nth order linear system, comprising:
   a measurement device configured to receive and measure an output signal resulting from supplying an input signal to the nth order linear system; and
   a processing device configured to compute the response characteristic of the nth order linear system from the output signal measurement by constructing a variance record of a non-uniformly sampled quantity measured by the measurement device and obtaining the response characteristic based on a mathematical relationship of the variance record to a response function.

14. The system of claim 13, wherein the nth order system is a phase locked loop, and wherein the input signal is a train of clock pulses.

15. The system of claim 14, wherein the output signal is a train of clock pulses, the measurable quantity is jitter of the output signal, and the variance record is a record of jitter variance of the output signal as a function of time.

16. The system of claim 13, wherein the response function is a transfer function and wherein the processing device is configured to generate an expression for the transfer function of the nth order linear system by fitting a variance model to the variance record and to determine parameters for the transfer function that also appear in the variance model and that produce the best fit for the variance model relative to the variance record of the measurable quantity.

17. The system of claim 16, wherein the processing device is configured to derive operational parameters from the transfer function and derive noise processes from a mathematical relationship between the transfer function and input and output noise power spectral density.

18. The system of claim 13, wherein the response characteristic is a power spectral density for the nth order linear system and wherein the processing device is further configured to obtain the response characteristic from a numerical solution to the mathematical relationship.

19. A computer program product comprising computer executable instructions for determining a response characteristic of an nth order linear system, the computer executable instructions comprising:
constructing a variance record of a non-uniformly sampled measurable quantity extracted from an output signal of the nth order linear system; and
obtaining the response characteristic of the nth order linear system from a mathematical relationship between the variance record of the measurable quantity and a response function of the nth order linear system.

20. The computer program product of claim 19, wherein the output signal is a train of clock pulses and the measurable quantity is jitter of the output signal, and wherein constructing a variance record comprises constructing a record of the jitter variance of the output signal as a function of time.

21. The computer program product of claim 20, wherein the response function is a transfer function, the computer executable instructions further comprising finding a jitter variance model that matches the jitter variance record by fitting a generic variance model to the jitter variance record.

22. The computer program product of claim 20, wherein the response function is a transfer function and wherein obtaining the response characteristic further comprises deriving operational parameters from the parameters of the transfer function.

23. The computer program product of claim 19, wherein the response characteristic is a power spectral density for the nth order linear system and wherein obtaining the response characteristic further comprises finding a numerical solution to the mathematical relationship.

24. A method for determining a response function of an nth order linear system, comprising:
supplying an input signal to the nth order linear system;
measuring an output signal of the nth order linear system that occurs in response to the input signal;
constructing a variance record of a measurable quantity extracted from the output signal; and
fitting a model containing parameters of the response function to a variance record based set of data by manipulating the parameters to provide a best fit of the model to the set of data.

25. The method of claim 24, wherein fitting a model further comprises:
finding a generic variance record model containing transfer function parameters; and manipulating the transfer function parameters to fit the variance record model to the variance record.

26. The method of claim 24, wherein fitting a model further comprises:
assuming the response function that is a pole-zero function and pole-zero locations;
solving a mathematical relationship including the pole-zero function and the variance record to produce a model variance record that is the model containing parameters of the response function;
comparing the model variance record to the constructed variance record; and
repetitively altering the pole-zero locations and resolving the mathematical relationship until the model variance record is best fit to the constructed variance record.

27. The method of claim 24, wherein fitting a model further comprises:
converting the constructed variance record to a derived power spectral density record;
assuming a pole-zero function; and
manipulating pole-zero locations of the pole-zero function to fit the pole-zero function to the power spectral density record.

28. A method for determining an error estimate of a response function estimated for an nth order linear system, comprising:
supplying an input signal to the nth order linear system;
measuring an output signal of the nth order linear system that occurs in response to the input signal;
constructing a variance record of a measurable quantity extracted from the output signal;
estimating the response function by fitting a model containing parameters of the response function to a variance record based set of data by manipulating the parameters to provide a best fit of the model to the set of data; and
measuring a residue between the model and the set of data to find the error estimate of the response function estimated for the nth order linear system.

29. The method of claim 28, wherein the variance record based set of data is a variance record, and wherein fitting a model further comprises:
finding a generic variance record model containing transfer function parameters; and manipulating the transfer function parameters to fit the variance record model to the variance record.

30. The method of claim 28, wherein the variance record based set of data is a variance record, and wherein fitting a model further comprises:
assuming the response function that is a pole-zero function and pole-zero locations;
solving a mathematical relationship including the pole-zero function and the variance record to produce a model variance record that is the model containing parameters of the response function;

comparing the model variance record to the constructed variance record; and repetitively altering the pole-zero locations and resolving the mathematical relationship until the model variance record is best fit to the constructed variance record.

31. The method of claim 28, wherein the variance record based set of data is a variance record, and wherein fitting a model further comprises:

converting the constructed variancerecord to a derived power spectral density record;

assuming a pole-zero function; and manipulating pole-zero locations of the pole-zero function to fit the pole-zero function to the power spectral density record.

32. A method for finding a response characteristic of an nth order linear system, comprising:

supplying an input signal to the nth order linear system;

obtaining a power spectral density record for an output signal of the nth order linear system produced in response to the input signal;

assuming a pole-zero function; and manipulating pole-zero locations of the pole-zero function to fit the pole-zero function to the power spectral density record.

33. The method of claim 32, wherein obtaining the power spectral density further comprises:

constructing a variance record of a measurable quantity from the output signal; and converting the variance record to a power spectral density record according to a mathematical relationship between the variance record and a response function of the nth order linear system.

34. The method of claim 33, wherein the mathematical relationship is a Fredholm integral and wherein converting the variance record comprises solving the Fredholm integral by applying filter banks dedicated to specific frequency bands.

* * * * *

UNITED STATES PATENT AND TRADEMARK OFFICE
CERTIFICATE OF CORRECTION

PATENT NO. : 6,813,589 B2
DATED : November 2, 2004
INVENTOR(S) : Li et al.

It is certified that error appears in the above-identified patent and that said Letters Patent is hereby corrected as shown below:

Column 10,
Line 8, "the. phase" should read -- the phase --

Column 13,
Line 9, "variancerecord" should read -- variance record --

Signed and Sealed this

Nineteenth Day of April, 2005

JON W. DUDAS
*Director of the United States Patent and Trademark Office*